US008814490B2

(12) United States Patent  
Inui (10) Patent No.: US 8,814,490 B2  
(45) Date of Patent: Aug. 26, 2014

(54) ARTICLE STORAGE FACILITY (75) Inventor: Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 386 days.

(21) Appl. No.: 12/936,984

(22) PCT Filed: Jan. 15, 2009

(86) PCT No.: PCT/JP2009/050474  
§ 371 (c)(1),  
(2), (4) Date: Dec. 22, 2010

(87) PCT Pub. No.: WO2009/125616  
PCT Pub. Date: Oct. 15, 2009

(65) Prior Publication Data  
US 2011/0158776 A1   Jun. 30, 2011

(30) Foreign Application Priority Data

Apr. 11, 2008 (JP) .................................. 2008-103926

(51) Int. Cl.  
*B65G 1/04* (2006.01)

(52) U.S. Cl.  
USPC ......................................................... 414/279

(58) Field of Classification Search  
CPC .............. B65G 1/04; B65G 1/06; B65F 9/10; B06F 9/106  
USPC ................... 414/279, 281, 282, 629, 631, 633  
IPC .............................. B65G 1/04, 1/06; B65F 9/10  
See application file for complete search history.

(56) References Cited

U.S. PATENT DOCUMENTS

| 7,441,999 B2 * | 10/2008 | Nakao et al. ............... 414/217.1 |
| 7,670,555 B2 * | 3/2010 | Hoover et al. ................. 422/65 |
| 7,676,278 B2 * | 3/2010 | Sasaki ............................. 700/2 |
| 2004/0109746 A1 * | 6/2004 | Suzuki .......................... 414/373 |
| 2006/0087927 A1 * | 4/2006 | Sasaki ....................... 369/30.27 |

FOREIGN PATENT DOCUMENTS

| JP | 5250487 | 4/1977 |
| JP | 61120440 U | 7/1986 |
| JP | 6260703 A | 3/1987 |

(Continued)

*Primary Examiner* — Saul Rodriguez  
*Assistant Examiner* — Brendan Tighe  
(74) *Attorney, Agent, or Firm* — The Webb Law Firm (57) ABSTRACT

An article storage facility is provided, which can reduce required space for installation in the rack fore and aft direction while preventing the configuration to become more complex. An article storage rack 2 having a plurality of storage units 1 arranged in a vertical direction and in a lateral direction, and an article transport device 4 which can transport articles 3 to each storage unit 1 in the article storage rack 2 are provided. The article transport device 4 consists of a movable body 12 movable in the rack lateral width direction of the article storage rack 2, a vertical movement guiding mast 13 movable in the rack fore and aft direction of the article storage rack 2 with respect to the movable body 12, and an article support 14 which is movable to a projected position for article transfer for the storage unit 1 and to a pulled back position away from the storage unit 1 by a movement of the vertical movement guiding mast 13 in the rack fore and aft direction and which is guided and supported by the vertical movement guiding mast 13 for vertical movement.

9 Claims, 9 Drawing Sheets

(56) References Cited

FOREIGN PATENT DOCUMENTS

| | | | |
|---|---|---|---|
| JP | 82615 A | 1/1996 | |
| JP | H9-315521 A | 12/1997 | |
| JP | 2000159304 A | | 6/2000 |
| JP | 2001171807 A | * | 6/2001 |
| JP | 200354705 A | | 2/2003 |
| JP | 2005272053 A | | 10/2005 |
| JP | 200874549 A | | 4/2008 |

* cited by examiner

ARTICLE STORAGE FACILITY

BACKGROUND OF THE INVENTION

1. Field of the Invention

The present invention relates to an article storage facility comprising an article storage rack having storage units arranged in a vertical direction and in a lateral direction, and an article transport device which is capable of transporting articles to each of the storage units in the article storage rack.

2. Description of the Related Art

An article storage facility such as one described above is used, for example, in an article transport facility, which includes an overhead transport device movable along a travel path provided near a ceiling and passing by a plurality of stations, to temporarily store articles to be transported by an overhead transport device to the stations. An article is, for example, a container for storing a plurality of semiconductor substrates. Each station is positioned on the floor in correspondence with each of a plurality of article processors which perform predetermined processing on semiconductor substrates. The overhead transport device is configured to transfer articles between stations by raising and lowering a grip portion which can grip an article with the article suspended from the grip portion.

And, in the article storage facility, the storage unit located in the upper most part of the article storage rack is configured to be a storage unit for taking articles in and out, into and out of which the overhead transport device can transfer an article, and the article transport device transports the articles between the storage unit for taking articles in and out and other storage units.

And, in a conventional article storage facility, a plurality of storage units in the article storage rack are arranged to form rows in the vertical direction and the lateral direction in the same position with respect to the fore and aft direction of the rack. The article transport device consists of a movable body which can move in the rack lateral width direction of the article storage rack, a vertically movable body which is guided and supported for vertical movement by a vertical movement guiding mast arranged vertically on the movable body, and an article support provided to the vertically movable body. And the article support is supported to the vertically movable body such that the article support can move, in the fore and aft direction of the article storage rack, between a projected position for article transfer with respect to the storage unit and a pulled back position away from the storage unit. (See, for example, Patent Document 1.)

In this conventional article storage facility, when the article transport device transfers an article to a storage unit, to which an article is to be transferred, among a plurality of storage units, after moving the article support to the position opposite the storage unit, which is the transfer target, by moving the movable body in the rack lateral width direction, and by raising and lowering the vertically movable body along the vertical movement guiding mast, the article to be transferred is transferred by moving the article support to project from the pulled back position to the projected position in the rack fore and aft direction.

Patent Document 1: Japanese Patent Application Publication No. H9-315521

SUMMARY OF THE INVENTION

In the conventional article storage facility described above, since the article support is supported by the vertically movable body for movement between the pulled back position and the projected position in the rack fore and aft direction, a structure for supporting the article support with the vertically movable body for movement in the rack fore and aft direction is required. For example, the article support is supported for movement by guide rails extending along the rack fore and aft direction and provided to the vertically movable body. And the article support is projected and pulled back along the rack fore and aft direction while restricting any movements in the vertical direction and the lateral direction. With this configuration, when the article support is located in the projected position, not the entire article support projects from the vertically movable body in the rack fore and aft direction. Instead, a part of the article support remains overlapped with the vertically movable body in the rack fore and aft direction, and the overlapping portion of the article support is supported by the guide rail provided to the vertically movable body. Therefore, the article support needs to be provided with a support structure for supporting the article as well as a part supported by the guide rail, etc. apart from the support structure, making the article support longer in the rack fore and aft direction.

Although, the article storage facility described in the above-mentioned patent document 1 includes a chuck means to grip the article, as an example of an article support such as one described above, there is no disclosure of any configuration for supporting the article support with the vertically movable body for movement in the rack fore and aft direction. To this end, since a fork-type article support supported by the vertically movable body for projecting and pulling back movement, for example, is sometimes used as an article support, the issue of the length in the rack fore and aft direction becoming longer is described using this fork-type article support.

Figure 9:
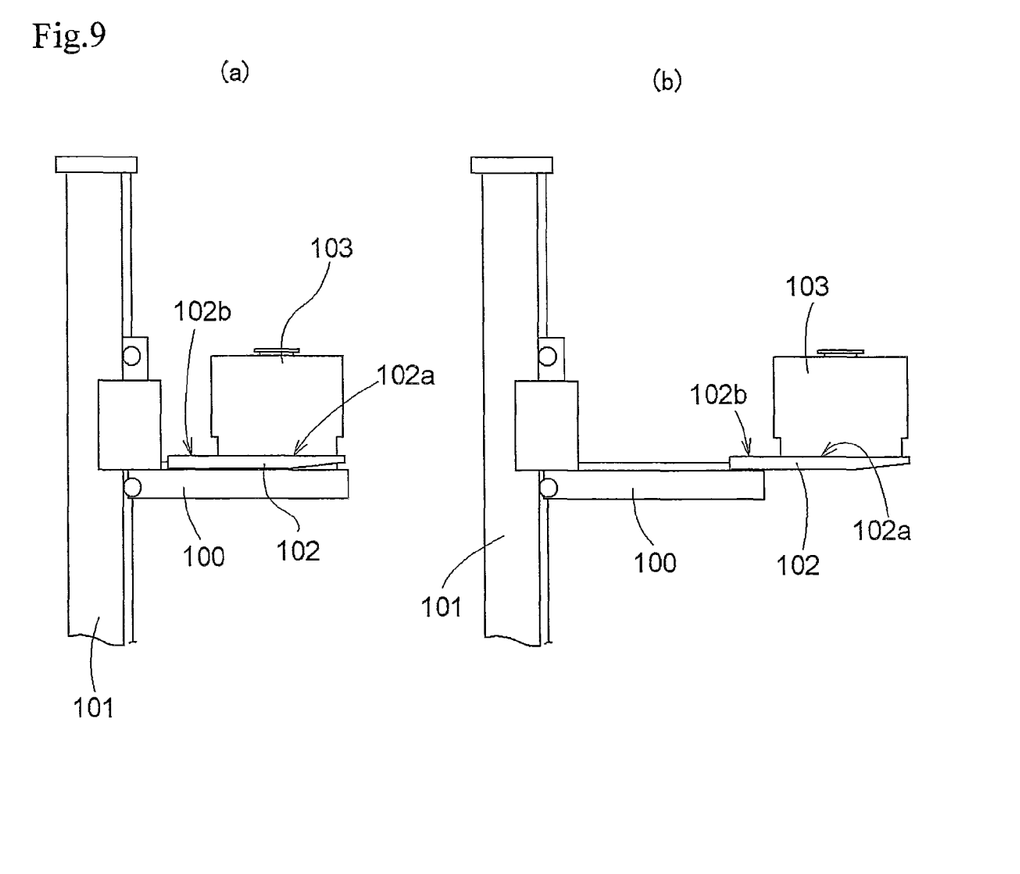
FIG. 9 is a drawing showing a vertically movable body and an article support of a conventional article storage facility.

As shown in FIG. 9, the vertically movable body 100 is guided by and supported to the vertical movement guiding mast 101 for movement in the vertical direction. The article support 102 is provided to be movable in the rack fore and aft direction (lateral direction in the drawing) with respect to the vertically movable body 100 between the pulled back position (see FIG. 9 (a)) and the projected position (see FIG. 9 (b)) with the use of the guide rail, etc. provided to the vertically movable body 100. The article support 102 includes, at its distal end side in the projecting direction, a placement support portion 102a which receives and support an article 103. As shown in FIG. 9 (b), when the article support 102 is located in the projected position, the proximal end portion of the article support 102 overlaps with the vertically movable body 100 in the rack fore and aft direction (lateral direction in the drawing), and the guide rail of the vertically movable body 100, etc. supports the overlapping proximal end portion of the article support 102. Therefore, the article support 102 requires a supported portion 102b which is supported by the guide rail of the vertically movable body 100, etc. in the rack fore and aft direction, in addition to the placement support portion 102a, thus making the structure longer in the rack fore and aft direction.

Therefore, since the article support is longer in the rack fore and aft direction, the vertically movable body needs to be long in the rack fore and aft direction. As a result, the article storage facility as a whole becomes large in size in the rack fore and aft direction. Especially in an article transport facility equipped with overhead transport devices described above, a plurality of article processors and a plurality of stations are required. Thus, smaller installation space for the article storage facility is desired, but this is difficult to attain.

And, when the article support is long in the rack fore and aft direction, the moment which acts downwardly on the article support becomes large, which tends to move the article support downwardly, thus requiring, for example, a structure to reinforce the portion of the vertical movement guiding mast for guiding and supporting of the vertically movable body. This tends to make the structure more complex. Although, for example, the portion of the vertically movable body, that is guided and supported by the vertical movement guiding mast, may be elongated in the vertical direction to reinforce the portion, this leads to a new problem in addition to having to provide this structure, which makes the structure more complex. Specifically, elongating the portion of the vertically movable body in the vertical direction, that is guided and supported by the vertical movement guiding mast, will increase the vertical dimension of the vertically movable body, resulting in problems such as an increase in the vertical dimension of the article storage rack, and a more limited vertical range in which the vertically movable body can move.

The present invention was made in light of these problems, and its object is to provide an article storage facility which can reduce the installation space in the rack fore and aft direction, while preventing the structure from becoming more complex.

To attain this object, the first characteristic configuration of an article storage facility in accordance with the present invention is that the article storage facility comprises an article storage rack having storage units arranged in a vertical direction and in a lateral direction, and an article transport device which is capable of transporting articles to each of the storage units in the article storage rack, characterized in that the article transport device includes a movable body movable in a rack lateral width direction of the article storage rack, a vertical movement guiding mast movable with respect to the movable body in the rack fore and aft direction of the article storage rack, and an article support which is movable to a projected position for article transfer to and from the storage unit and to a pulled back position away from the storage unit by a movement of the vertical movement guiding mast in the rack fore and aft direction, the article support being guided and supported by the vertical movement guiding mast for vertical movement.

Thus, the article transport device transfers articles to and from a storage unit by a movement of the movable body in the rack lateral width direction, a vertical movement of the article support, and a movement of the vertical movement guiding mast in the rack fore and aft direction. Since the article support moves in the rack fore and aft direction to transfer an article by a movement of the vertical movement guiding mast in the rack fore and aft direction, the article support only requires a support structure for supporting an article, allowing the article support to be more compact in the rack fore and aft direction. And by making the article support more compact in the rack fore and aft direction, the moment which acts downwardly on the article support can be reduced. Thus, for example, there is no need for a structure to reinforce the portion of the vertical movement guiding mast for guiding and supporting of the vertically movable body in order to prevent the downwardly movement of the article support. This helps prevent the structure from becoming more complex.

The structure discussed above makes it possible to provide an article storage facility which can reduce required space for installation in the rack fore and aft direction while preventing the configuration to become more complex.

The second characteristic configuration of the article storage facility of the present invention is that the storage units are arranged in the vertical direction and lateral direction and in the same position in the rack fore and aft direction, and the article transport device is configured to be capable of moving the article support to an opposite position which is opposite each storage unit in the rack fore and aft direction by a movement of the movable body in the rack lateral width direction and to be capable of moving the article support to the projected position for each storage unit by a movement of the vertical movement guiding mast in the rack fore and aft direction with the article support located in the opposite position.

That is, the article storage rack only needs to have storage units arranged in the vertical direction and the lateral direction in the same position in the rack fore and aft direction, allowing for simplification of the structure. The article transport device can move the article support to a position opposite each storage unit in the rack fore and aft direction by a movement of the movable body in the rack lateral width direction and can move the article support to the projected position for each storage unit by a movement of the vertical movement guiding mast in the rack fore and aft direction with the article support located in the opposite position. This allows the articles to be transferred to and from each storage unit, while simplifying the movements of the article transport device.

The third characteristic configuration of the article storage facility of the present invention is that end side storage units that are located at ends in the rack lateral width direction and a plurality of which are arranged in a vertical column among the storage units are positioned closer to the vertical movement guiding mast in the rack fore and aft direction than central storage units that are positioned in a central part in the rack lateral width direction and a plurality of which are arranged in a vertical column, and the article transport device is adapted to be capable of moving the article support to the projected position for the central storage unit and to an end side same position which is a same position as the end side storage unit in the rack fore and aft direction by a movement of the vertical movement guiding mast in the rack fore and aft direction with the article support located opposite the central storage unit in the rack fore and aft direction, and to be capable of moving the article support to the projected position for the end side storage unit by a movement of the movable body in the rack lateral width direction with the article support located in the end side same position.

That is, the central storage units and the end side storage units may be provided at different positions in the rack fore and aft direction, and the end side storage units may be positioned closer to the vertical movement guiding mast and adjacent to the central storage units. This allows the areas on both sides of the central storage units in the rack lateral width direction to be empty spaces. Therefore, these empty spaces may be utilized for other purposes.

For example, in an article transport facility having a overhead transporting device, at locations where the travel path along which the overhead transport device moves is curved, the article storage facility may be located as close to the travel path as possible by making use of the empty space without the storage facility overlapping with the travel path in the horizontal direction. Therefore, the space required to install the article storage facility can be made small at locations where the travel path is curved. As a result, the space created by saving the space for the article storage facility may be utilized as a space for installing other devices.

The article transport device can have the article support moved to a projected position for a central storage unit, and transfer articles to and from the central storage unit by a movement of the vertical movement guiding mast in the rack fore and aft direction with the article support located opposite the central storage unit in the rack fore and aft direction. And the article transport device positions the article support in the end side same position by positioning the article support in a pulled back position for the central storage unit, for example, with the article support located opposite the central storage unit in the rack fore and aft direction. Thus, the article transport device can have the article support moved to a projected position for an end side storage unit, and transfer an article to and from the end side storage unit by a movement of the movable body in the rack lateral width direction with the article support located in the end side same position. As a result, the article transport device can transfer articles properly both to the central storage units and the end side storage units.

The forth characteristic configuration of the article storage facility of the present invention is that the movable body is configured to be movable along a rack lateral width travel rail provided on a floor side and extending along the rack lateral width direction, and the vertical movement guiding mast is configured to be movable along a rack fore and aft travel rail provided to the movable body and extending in the rack fore and aft direction.

That is, one only needs to provide the rack lateral width travel rail to the floor side in order to move the movable body in the rack lateral width direction, thus, facilitating simplification of the structure. And the vertical movement guiding mast only needs to be able to move along the rack fore and aft travel rail provided to the movable body, thus facilitating simplification of the structure for allowing the vertical movement guiding mast to be movable along the rack fore and aft direction.

The fifth characteristic configuration of the article storage facility of the present invention is that one or more storage units arranged at the topmost part among the storage units are configured to be one or more storage units for taking articles in and out, to or from which an overhead transport device, which is movable along a travel path located near a ceiling, can transfer articles, and the article transport device is configured to be capable of transporting an article, which has been transferred from the overhead transport device to the storage unit for taking articles in and out, to other storage unit, and to be capable of transporting an article from a storage unit other than the storage unit for taking articles in and out to the storage unit for taking articles in and out.

That is, in an article transport facility equipped with an overhead transport device, and when using the article storage facility to temporarily store articles transported by the overhead transport device, one or more of the topmost storage units can function as a storage unit for taking articles in and out for transferring the articles to and from the overhead transport devices, making it unnecessary to provide a part for taking articles in and out, separate from the article storage rack, thus allowing the structure to be simplified.

And the article transport device can transport articles that have been transferred to the storage unit for taking articles in and out to other storage units, or can transport articles that have been stored in the storage units other than the storage unit for taking articles in and out to the storage unit for taking articles in and out and, can reliably transfer articles between the storage unit for taking articles in and out and the overhead transport device, and can store articles to be transported by the overhead transport device.

DETAILED DESCRIPTION OF THE INVENTION

Preferred embodiments of an article storage facility in accordance with the present invention is described next with reference to the attached drawings.

First Embodiment

Figure 1:
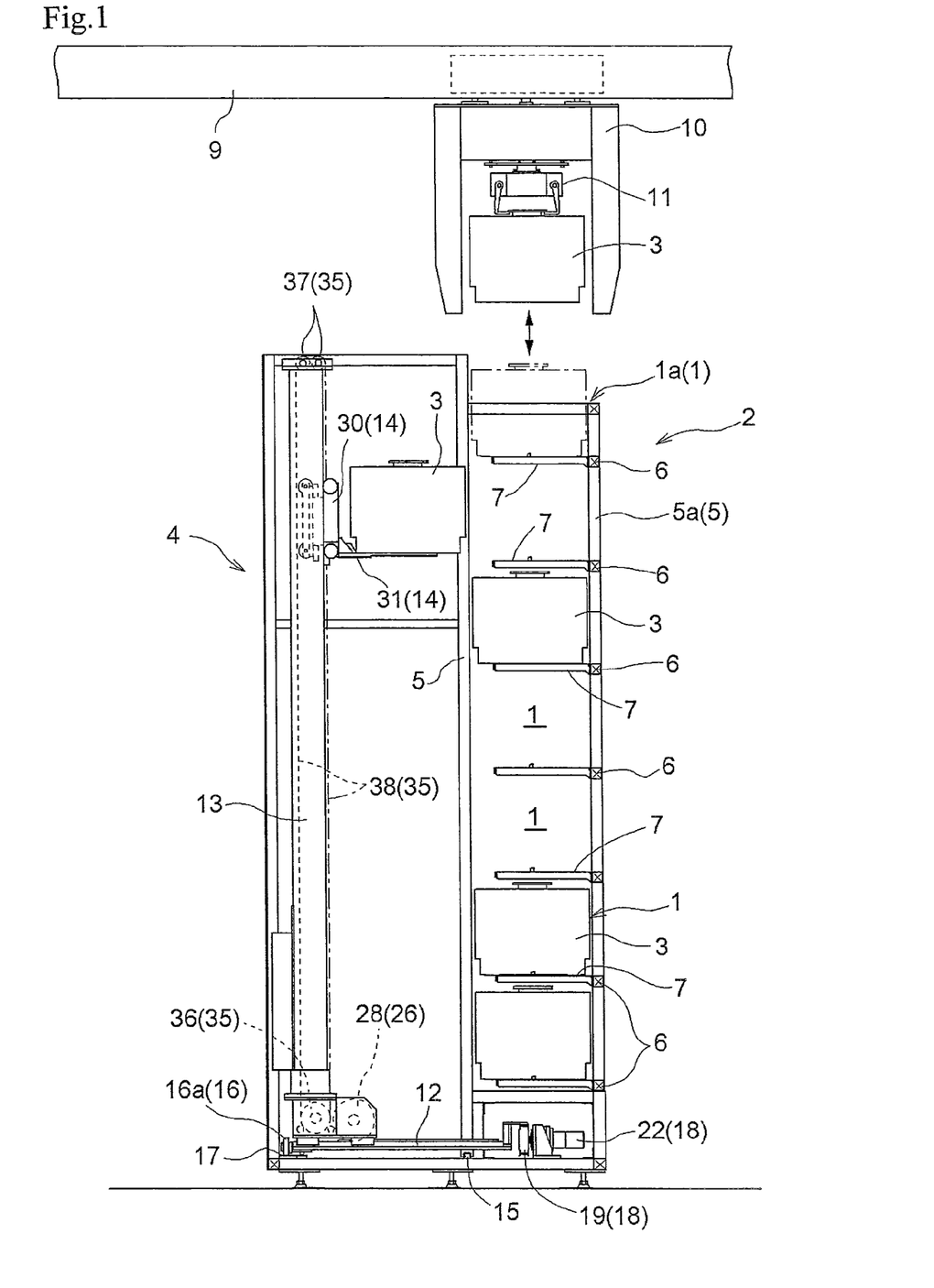
FIG. 1 is a side view of an article storage facility.
Figure 2:
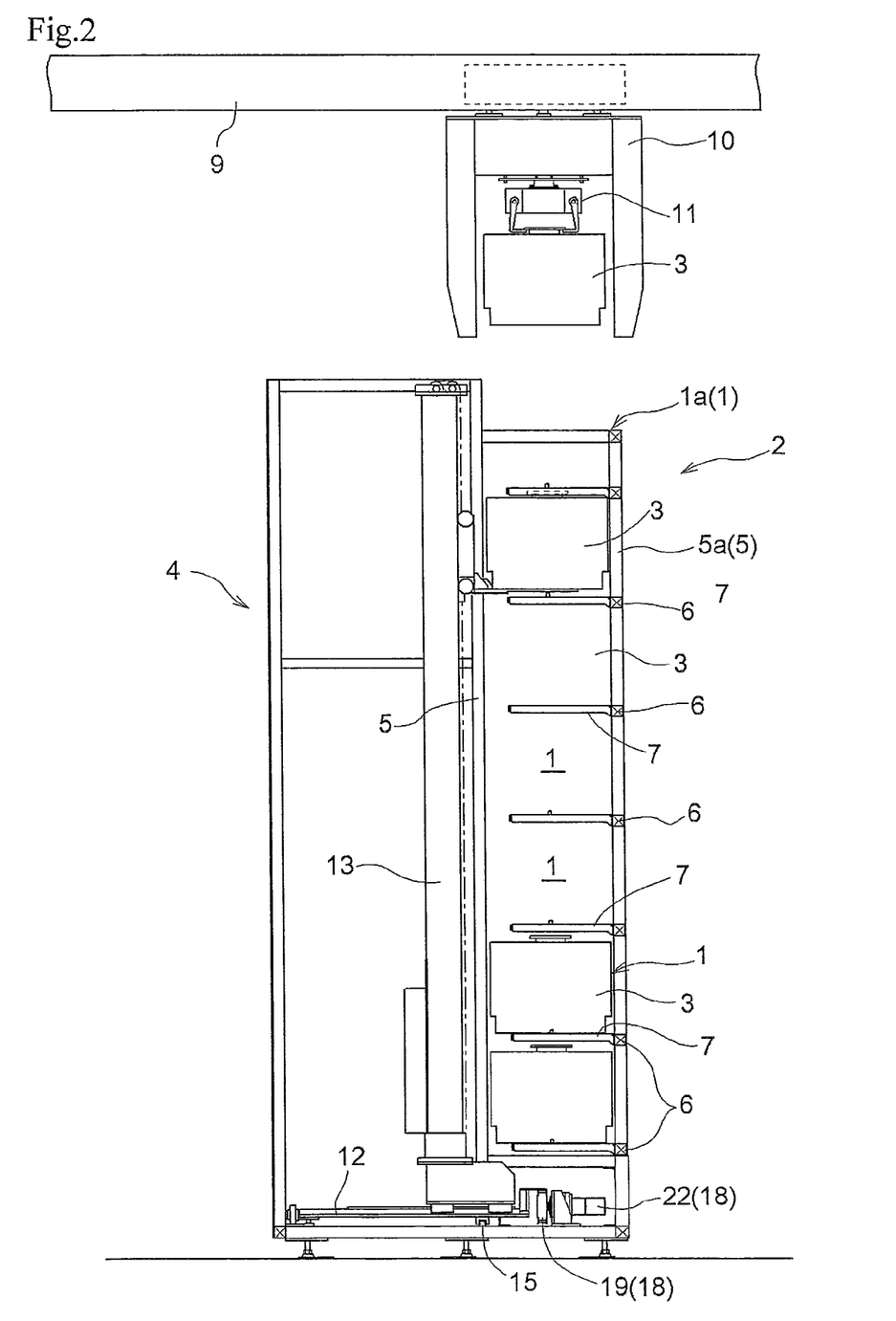
FIG. 2 is a side view of an article storage facility.
Figure 3:
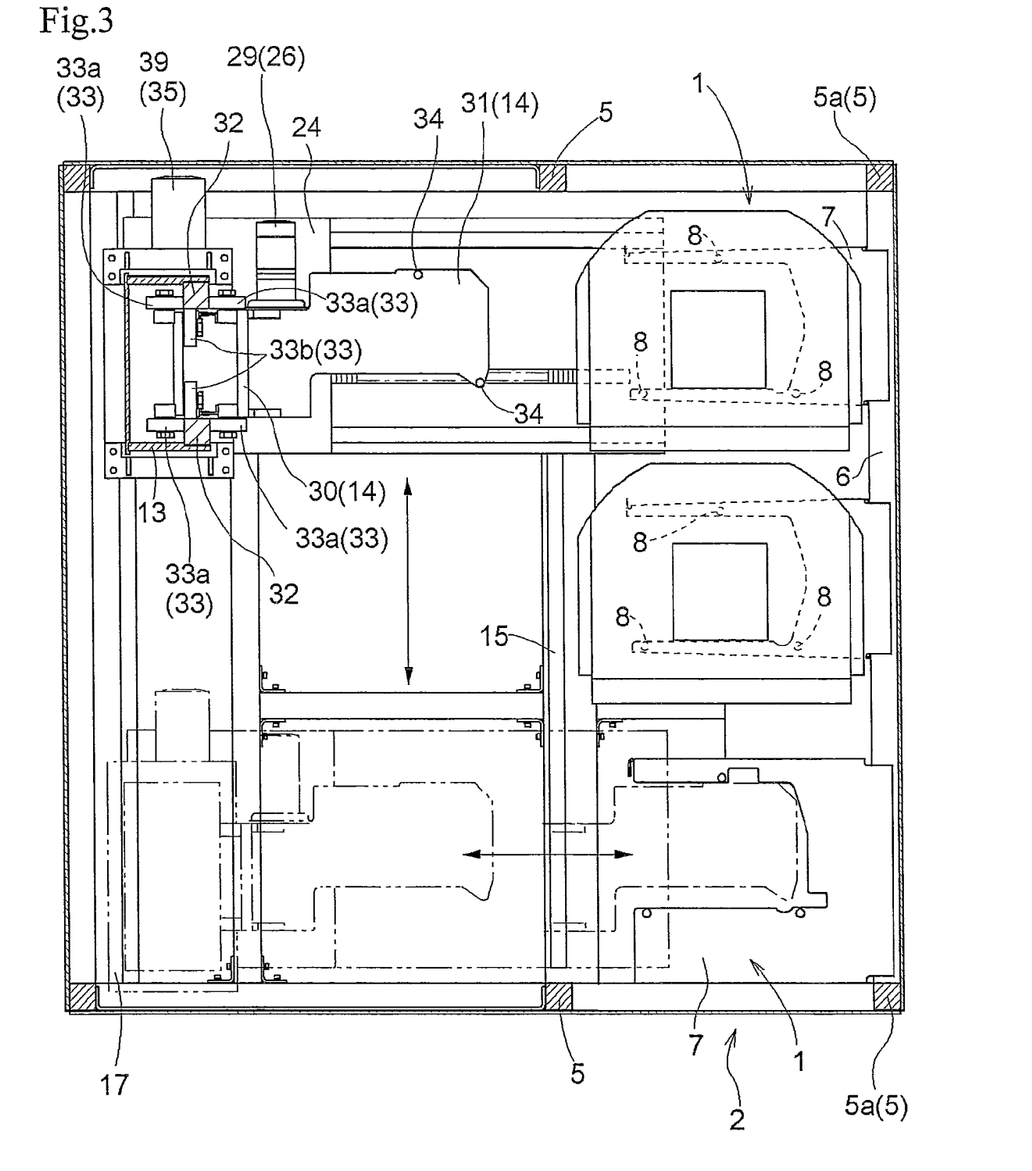
FIG. 3 is a plan view of the article storage facility.

As shown in FIGS. 1-3, the article storage facility is configured to be an enclosure having a box shape, and includes an article storage rack 2 provided with a plurality of storage units 1 arranged vertically and laterally, and an article transport device 4 which can transport articles 3 to each of the storage units 1 in the article storage rack 2. An article 3 is, for example, a container for storing a plurality of semiconductor substrates.

The following description is based on FIGS. 1-7.

The article storage rack 2 includes a front and back pair of side frames 5 spaced apart from each other in the rack fore and aft direction (lateral direction in FIG. 3), connecting frames 6 which interconnect the side frames 5a located in the back among the front and back pair of side frames 5, and placement support portions 7 provided to extend from the connecting frame 6 toward the front in the rack fore and aft direction. A plurality (e.g. seven) of the connecting frames 6 are provided at a predetermined interval in the vertical direction, and a plurality (e.g. three) of the placement support portions 7 are provided to extend in parallel to each other in the horizontal direction. The placement support portion 7 is formed to be bracket-shaped in plan view, and is configured such that its central part in the rack lateral width direction (vertical direction in FIG. 3) is hollow.

The storage unit 1 is configured to store an article 3 with the article 3 placed on and supported by the placement supporting portion 7. The plurality of storage units 1 are arranged so that they line up in the vertical and lateral directions in the same position with respect to the rack fore and aft direction. Three positioning pins 8 are provided in the placement support portion 7, and the storage unit 1 is configured to store an article 3 with the article 3 located in position with the positioning pins 8 fit into the holes provided to the bottom of the article 3.

One or more of the storage units 1 among the plurality of storage units 1 in the topmost part is configured to be a storage unit 1a for taking articles in and out, to and from which the overhead transport device 10, which moves along the travel rail 9 (or a travel path) near the ceiling, can transfer articles 3. That is, the one or more storage units 1a in the topmost part of the article storage rack 2 are not provided with any members that cover their upper portion, so that their upper portions are open. The overhead transport device 10 is provided with a grip portion 11 which is capable of suspending and gripping an article 3. And the overhead transport device 10 is configured to transfer articles 3 to and from the storage unit 1a for taking articles in and out by raising and lowering the grip portion 11 while stopped on the travel rail 9 at the stop location (i.e. the location above the storage unit 1a for taking articles in and out) corresponding to the storage unit 1a for taking articles in and out. Thus, this article storage facility is configured to store articles 3, transported by the overhead transport device 10, in the article storage rack 2.

The article transport device 4 consists of a movable body 12 which can move in the rack lateral width direction of the article storage rack 2, a vertical movement guiding mast 13 which can move in the rack fore and aft direction of the article storage rack 2 with respect to the movable body 12, and an article support 14, which can be moved to a projected position (see FIG. 2) for transferring an article to and from a storage unit 1 and to a pulled back position (see FIG. 1) away from the storage unit 1 by a movement of the vertical movement guiding mast 13 along the rack fore and aft direction, and which is guided and supported by the vertical movement guiding mast 13 for vertical movement.

The movable body 12 is formed to be rectangular-shaped, which is short along the rack lateral width direction and long along the rack fore and aft direction (see FIGS. 3, 5, and 6), and is configured to be movable along the rack lateral width travel rail 15 extending in the rack lateral width direction provided on or near the floor. The rack lateral width travel rail 15 is configured to support a portion of the movable body 12, that is close to the article storage rack 2 in the rack fore and aft direction, for movement in the rack lateral width direction. And, travel guide rollers 16, which are rotatable about horizontal axes, are provided in the end portion of the movable body 12 that is away from the article storage rack 2 in the rack fore and aft direction, and a travel guide portion 17 for guiding these travel guide rollers 16 is provided along the rack lateral width direction.

Figure 4:
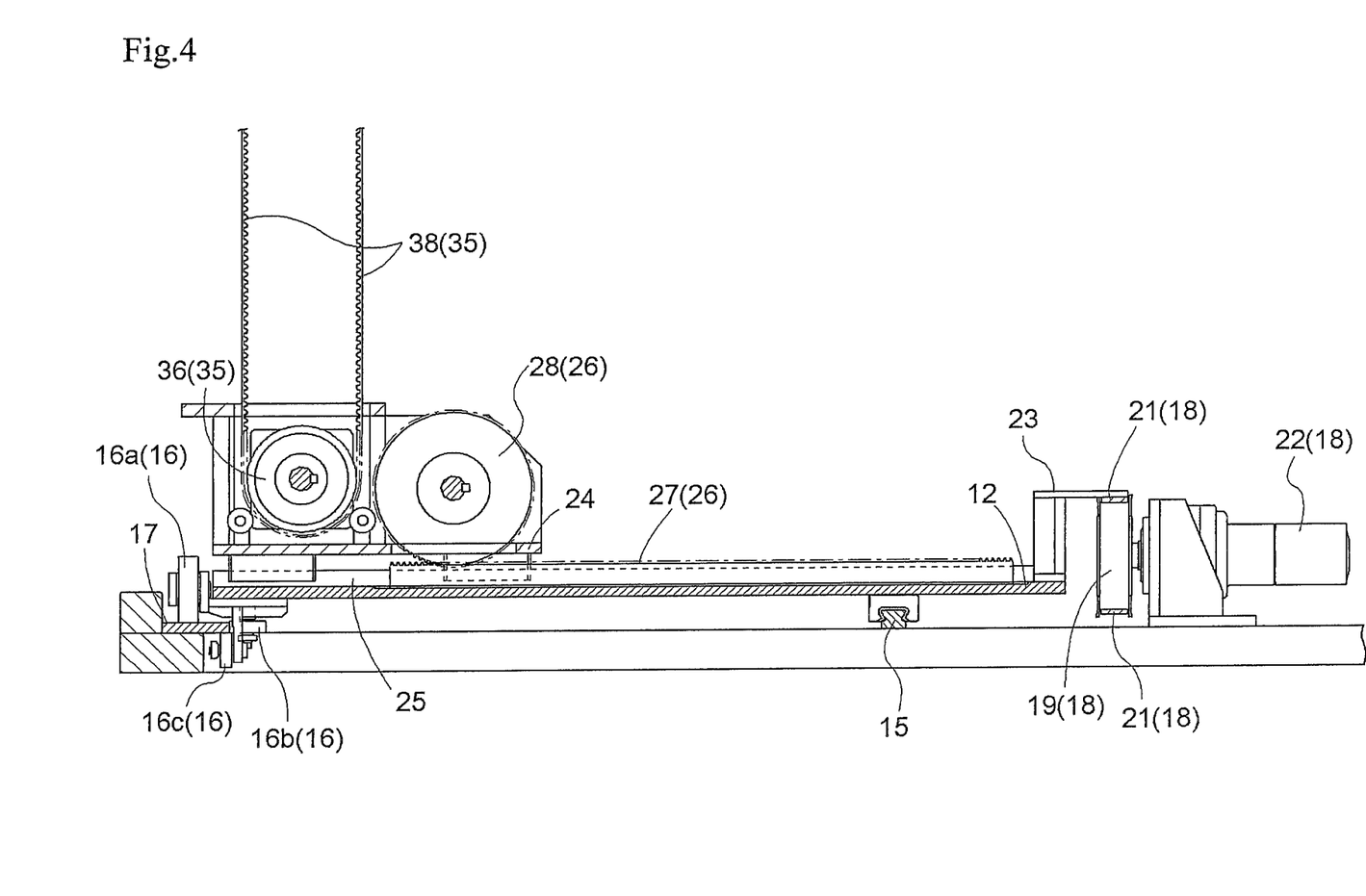
FIG. 4 is an enlarged view of the principal portion of the article storage facility as viewed in a rack lateral width direction.
Figure 7:
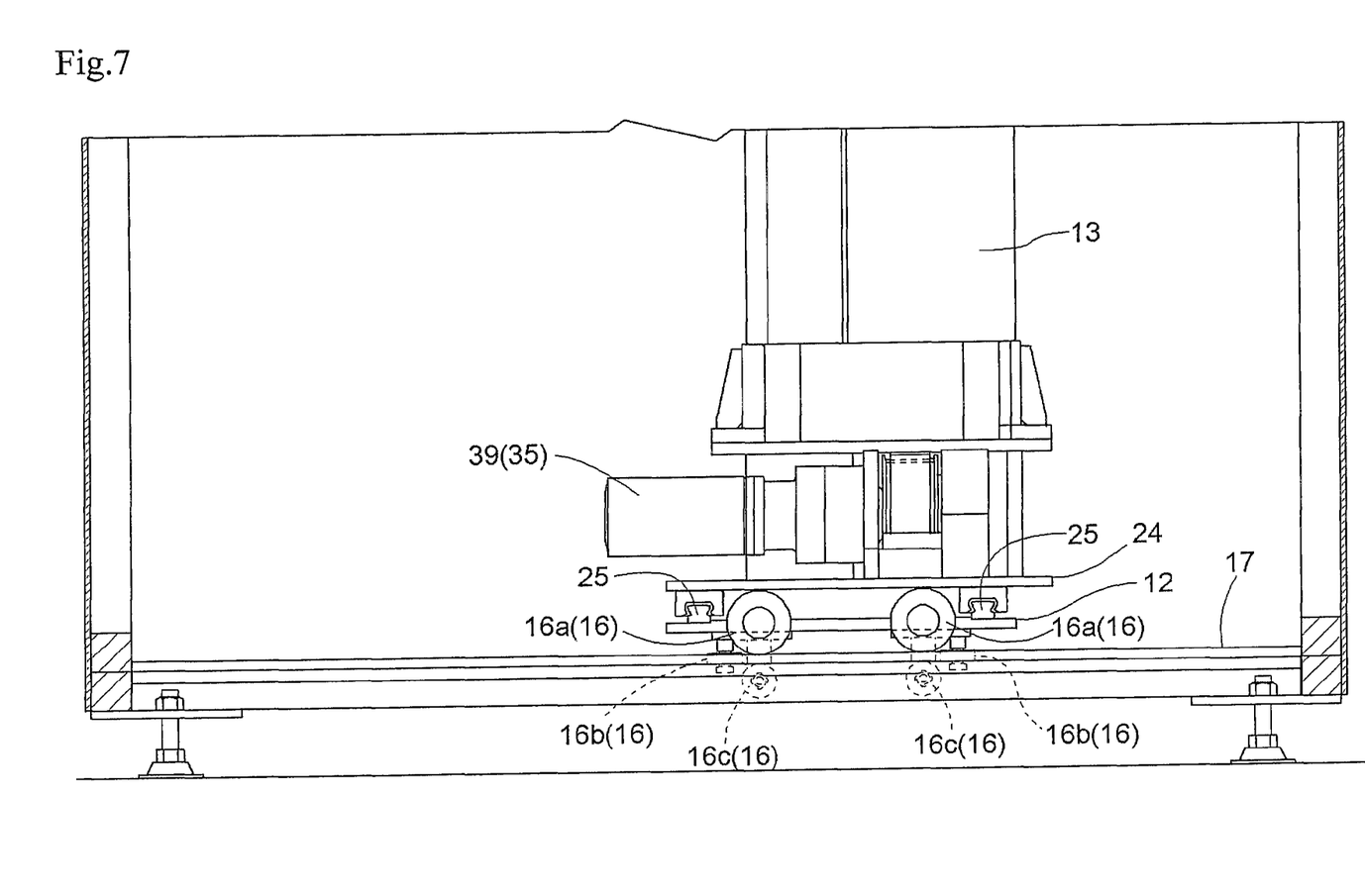
FIG. 7 is an enlarged plan view of the principal portion of the article storage facility as viewed in a rack fore and aft direction.

As shown in FIGS. 4 and 7, three different kinds of travel guide rollers 16 are provided: a first travel guide roller 16a in contact with the upper surface portion of the travel guide portion 17, a second travel guide roller 16b in contact with the side surface portion of the travel guide portion 17, and a third travel guide roller 16c in contact with the lower surface portion of the travel guide portion 17. Thus, because the travel guide portion 17 is cramped from above and below by the travel guide rollers 16, and because of the contact between the side surface of the travel guide portion 17 and the travel guide roller 16, and of the guiding function of the rack lateral width travel rail 15, the movable body 12 can be moved in the rack lateral width direction with any movements in the vertical direction and the rack fore and aft direction being restricted.

Figure 5:
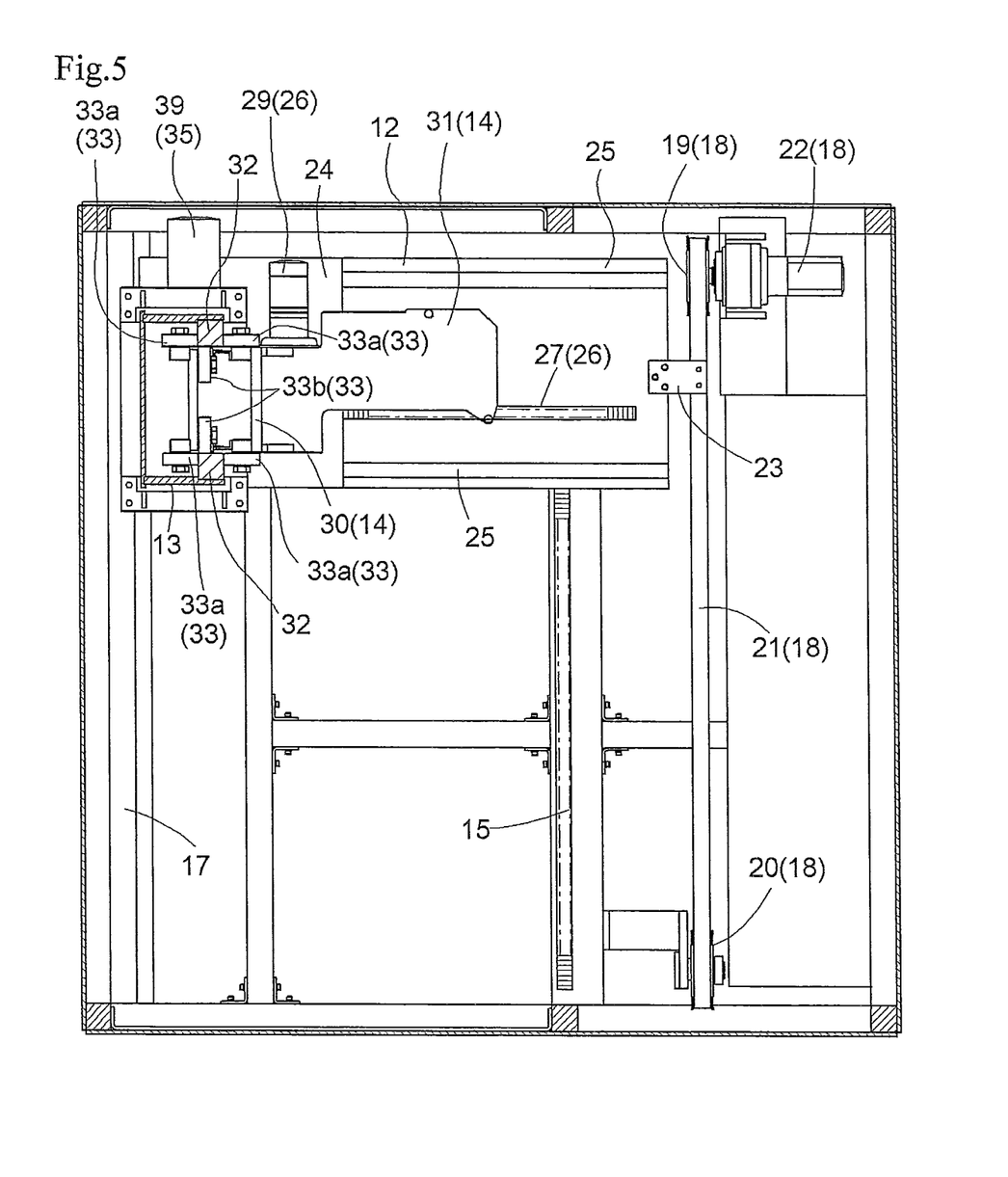
FIG. 5 is an enlarged plan view of the principal portion of the article storage facility.

The movable body actuating means 18 for moving the movable body 12 in the rack lateral width direction is provided in the space under the article storage rack 2. As shown in FIGS. 4 and 5, the movable body actuating means 18 consists of an endless movable body drive belt 21 which is wound around the movable body actuating rotating body 19 located in one end portion in the rack lateral width direction, and a movable body driven rotating body 20 located in the other end portion in the rack lateral width direction, and a movable body drive motor 22 which rotates the movable body actuating rotating body 19. An end portion of the movable body 12 closer to the article storage rack 2 in the rack fore and aft direction is connected to the movable body drive belt 21 by a movable body connection portion 23. The movable body actuating means 18 is configured to move the movable body 12 in the rack lateral width direction by rotating the movable body actuating rotating body 19 with the movable body drive motor 22 and thus by moving the movable body drive belt 21.

The vertical movement guiding mast 13 is arranged to stand vertically on the pedestal 24 formed in the shape of a rectangle spanning the total length of the movable body 12 in the rack lateral width direction. The pedestal 24 is supported for movement in the rack fore and aft direction by the rack fore and aft travel rails 25 provided to the movable body 12 and extending along the rack fore and aft direction. The rack fore and aft travel rails 25 consist of a pair of rails which are separated from each other in the rack lateral width direction and are configured to movably support each of one end portion and the other end portion of the pedestal 24 in the rack lateral width direction.

Figure 6:
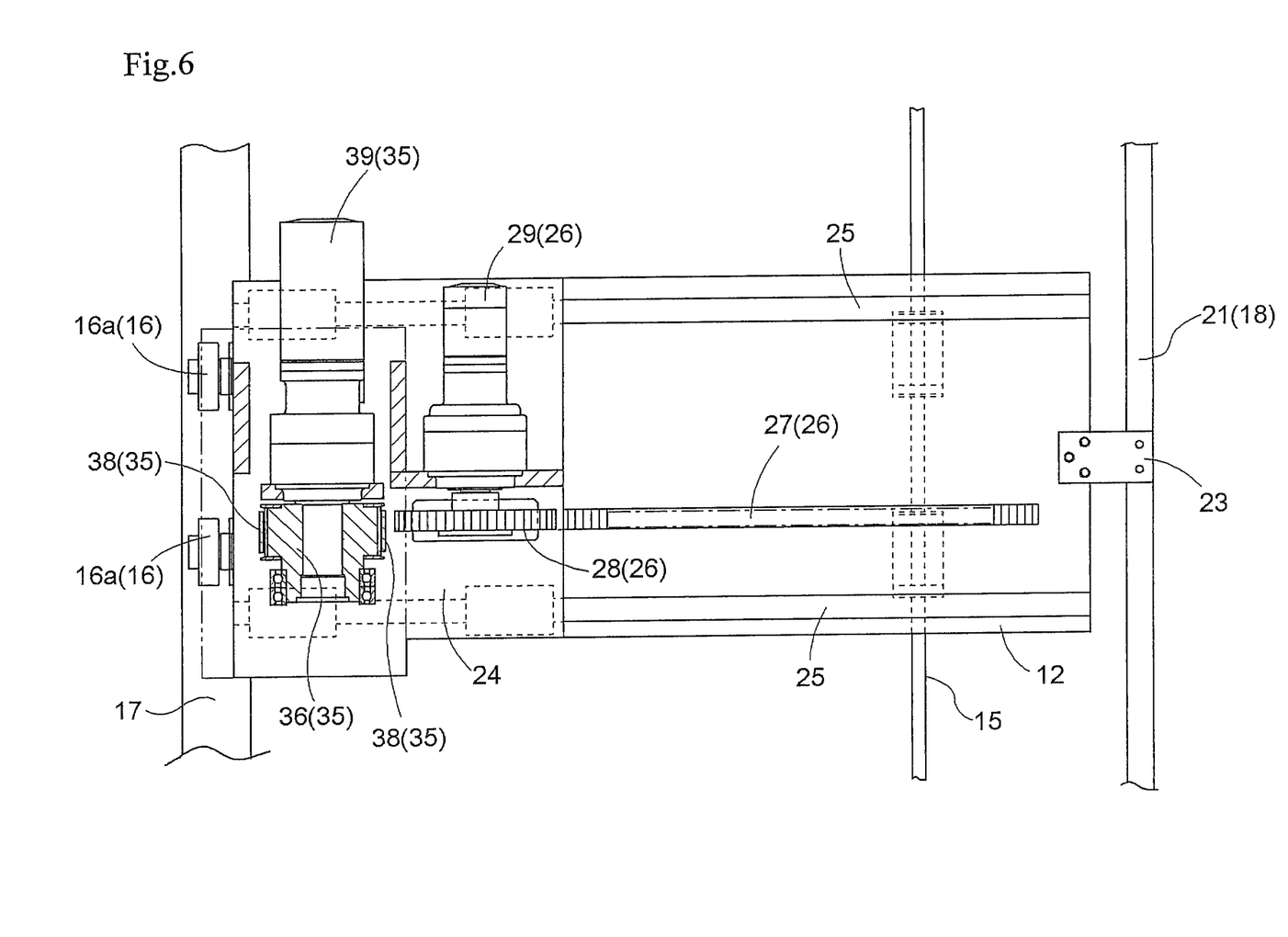
FIG. 6 is an enlarged plan view of the principal portion of the article storage facility.

A vertical movement guiding mast actuating means 26 is provided to move the vertical movement guiding mast 13 in the rack fore and aft direction. As shown in FIGS. 4 and 6, the vertical movement guiding mast actuating means 26 consists of a rack portion 27 arranged in the movable body 12 along the rack fore and aft direction, a pinion 28 which can rotate while engaging the rack portion 27, and a vertical movement guiding mast drive motor 29 which rotates the pinion 28. The vertical movement guiding mast actuating means 26 is configured to move the vertical movement guiding mast 13 in the rack fore and aft direction by rotating the pinion 28 with the vertical movement guiding mast drive motor 29.

The article support 14 consists of a guide portion 30 guided by the vertical movement guiding mast 13 for vertical movement, and a plate-shaped support portion 31 provided to extend horizontally from the guide portion 30 to support an article 3. Since the article support 14 moves in the rack fore and aft direction by the movement of the vertical movement guiding mast 13 in the rack fore and aft direction, the support portion 31 is required only to have a length, in the rack fore and aft direction, that is sufficient to support the article 3, thus making it possible for the length of the support portion 31 to be as short as possible. Therefore, it is possible for the length of the article support 14 in the rack fore and aft direction to be shortened, and the article storage facility may be made compact in the rack fore and aft direction.

The guide portion 30 is provided with vertical movement guide rollers 33 which are in contact with the guide portions 32 of the vertical movement guiding mast 13 and which can rotate freely about horizontal axes. As shown in FIGS. 3 and 5, one pair of the guide portions 32 are provided to be spaced apart from each other in the rack lateral width direction, and the vertical movement guide rollers 33 contact each of the pair of the guide portions 32. The vertical movement guide rollers 33 consist of two kinds of rollers: first vertical movement guide rollers 33a that sandwich the guide portion 32 from both sides in the rack fore and aft direction to restrict movements of the article support 14 in the rack fore and aft direction, and second vertical movement guide rollers 33b that contact the guide portion 32 in the rack lateral width direction to restrict movements of the article support 14 in the rack lateral width direction. The support portion 31 is formed to be narrow in the rack lateral width direction so that, in its projected position, it can pass vertically through the hollow space in the placement support portion 7 of the storage unit 1. And, two positioning pins 34 are provided in the support portion 31, and the support portion 31 is configured to support the article 3 while maintaining it in position by fitting these positioning pins 34 into the holes formed in the bottom of the article 3.

A vertical movement actuating means 35 is provided to the vertical movement guiding mast 13 to raise and lower the article support 14. As shown in FIGS. 1, 2 and 4, the vertical movement actuating means 35 consists of an endless vertical movement drive belt 38 which is wound around the vertical movement actuating rotating body 36 located in the lower end portion of the vertical movement guiding mast 13 and a vertical movement driven rotating body 37 located in the upper end portion of the vertical movement guiding mast 13, and a vertical movement drive motor 39 which rotates the vertical movement actuating rotating body 36. The guide portion 30 of the article support 14 is connected with an intermediate portion of the vertical movement drive belt 38. And the vertical movement actuating means 35 is configured to raise and lower the article support 14 by rotating the vertical movement actuating rotating body 36 with the vertical movement drive motor 39, and thus by moving the vertical movement drive belt 38.

The article transport device 4 is configured to move the article support 14 to a position opposite each storage unit 1 in the rack fore and aft direction by a movement of the movable body 12 in the rack lateral width direction, and to move the article support 14 to the projected position for each storage unit 1 by a movement of the vertical movement guiding mast 13 in the rack fore and aft direction with the article support 14 located at the opposite position.

As shown in FIGS. 1 and 3, the article transport device 4 is configured to position the article support 14 in the pulled back position by locating the vertical movement guiding mast 13 in the end portion, of the movable body 12 in the rack, that is away from the storage unit 1 in fore and aft direction. As shown in FIG. 3 by the arrow in the rack lateral width direction (the vertical direction in the drawing), the article transport device 4 is capable of moving the article support 14 in the rack lateral width direction without the article support 14 interfering with the storage unit 1, by moving the movable body 12 in the rack lateral width direction with the article support 14 located in the pulled back position. Thus, the article transport device 4 is configured to move the article support 14 to the position opposite each storage unit 1 by moving the movable body 12 in the rack lateral width direction with the article support 14 located in the pulled back position. As shown in FIGS. 2 and 3, with the article support 14 located in the position opposite a certain storage unit 1, the article transport device 4 is configured to move the article support 14 to the projected position for the storage unit 1 by moving the vertical movement guiding mast 13 to the end portion, of the movable body 12, which is closer to the storage unit 1 in the rack fore and aft direction as shown in FIG. 3 with the arrow in the rack fore and aft direction (lateral direction in the drawing).

Although not shown, a control device for controlling the operation of the article transport device 4 is provided, and this control device is configured to control the operation of the article transport device 4 to retrieve an article 3 stored in a storage unit 1, which the article is to be retrieved from, and to store an article 3 in a storage unit 1, which the article is to be stored in.

With the article support 14 located in the pulled back position, in order to move the article support 14 to the position opposite the storage unit 1 from which an article is to be retrieved, the control device controls the operation of the movable body actuating means 18 and the operation of the vertical movement actuating means 35 to move the movable body 12 in the rack lateral width direction and to raise and lower the article support 14 with the vertical movement guiding mast 13 guiding the movement. The position opposite each storage unit 1 is stored in the control device in advance. And, although not shown, a rack lateral width direction position detection means for detecting the location of the article support 14 in the rack lateral width direction, and a vertical position detection means for detecting the location of the article support 14 in the vertical direction are provided. And the control device is configured to control the operation of the movable body actuating means 18 based on the detected information from the rack lateral width direction position detection means to move the article support 14 to the same position in the rack lateral width direction as the position opposite an article storage unit, and to control the operation of the vertical movement actuating means 35 based on the detected information from the vertical position detection means to move the article support 14 to the same position in the vertical direction as the opposite position. Incidentally, for example, a distance sensor, which detects a distance to an object by emitting distance measuring laser light to the object and receiving the reflected light, may be adapted as the rack lateral width direction position detection means.

With the article support 14 located in the position opposite the storage unit 1 from which an article is to be retrieved, the control device controls the operation of the vertical movement guiding mast actuating means 26 to move the vertical movement guiding mast 13 to the end portion of the movable body 12 closer to the storage unit 1 in the rack fore and aft direction. This causes the support portion 31 of the article support 14 to be inserted into the hollow space in the placement support portion 7 of the storage unit 1, and the article support 14 to be located in the projected position. And the control device controls the operation of the vertical movement actuating means 35 to raise the article support 14 by a predetermined distance while guided by the vertical movement guiding mast 13. The article 3 is scooped up or retrieved from the storage unit 1 in this manner with the article 3 placed on and supported by the support portion 31 of the article support 14. Thereafter, the control device controls the operation of the vertical movement guiding mast actuating means 26 to move the vertical movement guiding mast 13 to the end portion of the movable body 12 which is located away from the storage unit 1 in the rack fore and aft direction.

With the article support 14 located in the pulled back position with an article 3 placed on and supported by the article support 14, in order to move the article support 14 to the position opposite the storage unit 1 in which the article is to be stored, the control device controls the operation of the movable body actuating means 18 and the operation of the vertical movement actuating means 35 to move the movable body 12 in the rack lateral width direction and to raise and lower the article support 14 with the vertical movement guiding mast 13 guiding the movement. And, similar to the scooping up operation of the article 3 from the storage unit 1, the control device controls the operation of the vertical movement guiding mast actuating means 26 to move the vertical movement guiding mast 13 to the end portion of the movable body 12 which is located closer to the storage unit 1 in the rack fore and aft direction and then controls the operation of the vertical movement actuating means 35 to lower the article support 14 by a predetermined distance while guided by the vertical movement guiding mast 13, which is a reverse operation to when the article 3 is scooped up from a storage unit 1. The article 3 is unloaded to the storage unit 1 from the article support 14 in this manner.

The article transport device 4 is configured to be capable of transporting articles 3, which have been transferred from the overhead transport device 10 to the storage unit 1a for taking articles in and out, to other storage units 1, and to be capable of transporting articles 3, stored in storage units 1 other than the storage unit 1a for taking articles in and out, to the storage unit 1a for taking articles in and out. More specifically, when an article 3 is brought in from the overhead transport device 10 to the storage unit 1a for taking articles in and out, the control device is configured to control the operation of the article transport device 4 to store the article that has been stored in the storage unit 1a for taking articles in and out, in other storage unit 1 in which the article 3 is not stored. And when transporting an article 3 stored in the storage unit 1 with the overhead transport device 10, the control device is configured to control the operation of the article transport device 4 to store the article 3 that has been stored in the storage unit 1, in the storage unit 1a for taking articles in and out.

Second Embodiment

This second embodiment is an alternative embodiment in which the arrangement of the storage units 1 of the article storage rack 2 differs from that in the first embodiment described above.

Figure 8:
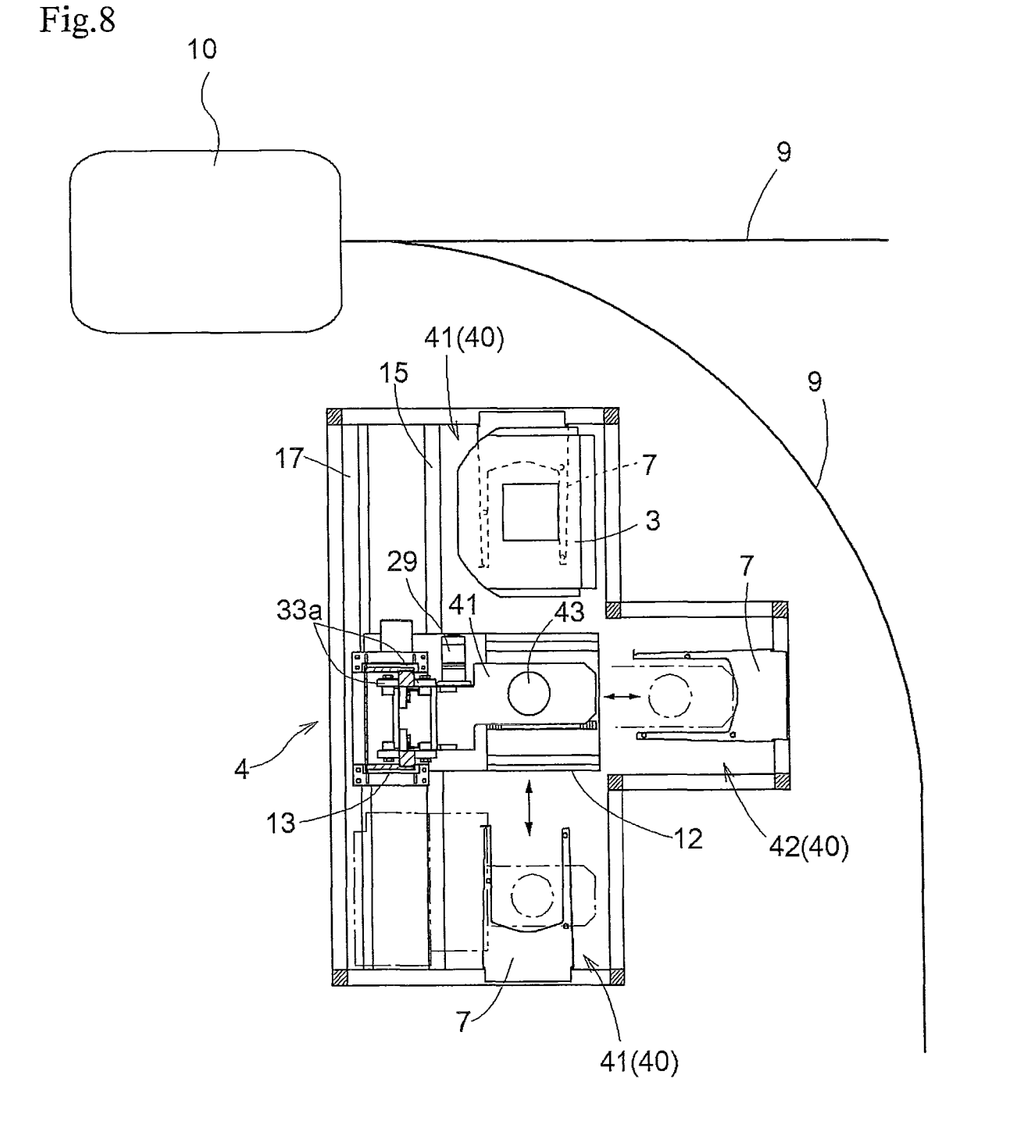
FIG. 8 is a plan view of the article storage facility according to the second embodiment.

As shown in FIG. 8, the end side storage units 41, located at the end areas in the rack lateral width direction (the vertical direction in the drawing), among the plurality of storage units 40 in the article storage rack 2, are located closer to the vertical movement guiding mast 13 in the rack fore and aft direction than the central storage units 42 arranged in the central part in the rack lateral width direction. That is, the central storage units 42 and the end side storage units 41 are located at different positions in the rack fore and aft direction (right and left direction in the drawing), and the end side storage units 41 are located closer to the vertical movement guiding mast 13 and adjacent to the central storage unit 42. And the direction along which an article 3 is brought into and taken out from the central storage units 42 is set to be along the rack fore and aft direction, and the direction along which an article 3 is brought into and taken out from the end side storage units 41 is set to be along the rack lateral width direction.

This allows the areas on both sides of the central storage units 41 in the rack lateral width direction to be empty spaces. Therefore, at locations where the travel rail 9 along which the overhead transport device 10 moves is curved, the article storage facility may be located as close to the travel rail 9 as possible by making use of the empty space. That is, when arranging the article storage facility at a location where the facility does not overlap with the travel rail 9 in the horizontal direction so that it does not interfere with the movement of the overhead transport device 10, the article storage facility can be brought as close to, and to match the shape of, the curved travel rail 9. Therefore, the space required to install the article storage facility can be made small at locations where the travel rail 9 is curved. As a result, the space created by saving the space for the article storage facility may be utilized as an installation space for article processors, thus contributing to an effective use of space.

The article transport device 4 is configured to move the article support 14 to the projected position for the central storage unit 42 and to the end side same position which is the same position as the end side storage units 41 in the rack fore and aft direction by the movement of the vertical movement guiding mast 13 in the rack fore and aft direction with the article support 14 positioned to face the central storage unit 42 in the rack fore and aft direction, and to move the article support 14 to the projected position for the end side storage units 41 by moving the movable body 12 in the rack lateral width direction with the article support 14 located in the end side same position.

The support portion 31 of the article support 14 has a different structure from one in the first embodiment described above. For example, the support platform 43, which is narrow in both the rack lateral width direction and the rack fore and aft direction, is provided on the support portion 31, and is configured to support the article 3. And the support platform 43 has the height corresponding to the set distance at the time of locating and vertically moving the article support 14 in the projected position with respect to the end side storage unit 41 and the central storage unit 42.

This allows the support platform 43 to be inserted into and retrieved from the hollow space in the placement support portion 7 in the central storage unit 42 in the rack fore and aft direction, and to be inserted into and retrieved from the hollow space of the placement support portion 7 in the end side storage unit 41 in the rack lateral width direction. Furthermore, the support platform 43 is configured to be able to pass through the hollow space of the placement support portion 7 in the central storage unit 42 in the vertical direction, and through the hollow space of the placement support portion 7 in the end side storage unit 41 in the vertical direction.

When transferring an article 3 to and from a central storage unit 42, as shown by the arrow extending along the lateral direction in the drawing, the control device, with the article support 14 located in the pulled back position and opposite the central storage unit 42, controls the operation of the vertical movement guiding mast actuating means 26 to move the vertical movement guiding mast 13 to the end portion of the movable body 12 which is located close to the central storage unit 42 in the rack fore and aft direction. This causes the support platform 43 on the support portion 31 of the article support 14 to be inserted into the hollow space in the placement support portion 7 of the central storage unit 42, and the article support 14 to be located in the projected position for the central storage unit 42. Thereafter, the control device controls the operation of the vertical movement actuating means 35 to raise or lower the article support 14 by the set distance, with the article support 14 guided by the vertical movement guiding mast 13, to cause the support platform 43 to pass through the hollow space of the placement support portion 7 of the central storage unit 42 in the vertical direction to scoop or receive the article 3 from the central storage unit 42, or to unload the article 3 to the central storage unit 42.

When transferring an article 3 to and from an end side storage unit 41, as the control device controls the operation of the article transport device 4 to locate the article support 14 in the pulled back position and opposite the central storage unit 42, the article support 14 is caused to be located in the end side same position which is the same position as the end side storage unit 41 in the rack fore and aft direction. And the control device controls the operation of the movable body actuating means 18 to move the movable body 12 in the rack lateral width direction, as shown by the arrow in the vertical direction in the drawing, with the article support 14 located in the end side same position. This causes the support platform on the support portion 31 of the article support 14 to be inserted into the hollow space in the placement support portion 7 of the end side storage unit 41, and the article support 14 to be located in the projected position for the end side storage unit 41. Thereafter, the control device controls the operation of the vertical movement actuating means 35 to raise or lower the article support 14 by the set distance, with the article support 14 guided by the vertical movement guiding mast 13, to cause the support platform 43 to pass through the hollow space of the placement support portion 7 of the end side storage unit 41 in the vertical direction to scoop or receive the article 3 from the end side storage unit 41, or to unload the article 3 to the end side storage unit 41.

Alternative Embodiments (1) In the embodiments described above, a movable body which is movable along a rack lateral width travel rail extending along the rack lateral width direction provided near the ceiling may be provided. And a vertical movement guiding mast, which can move along a rack fore and aft travel rail provided to the movable body to extend along the rack fore and aft direction, may be provided.

(2) Although, in the embodiments described above, the article storage facility according to the present invention is adapted to the article transport facility having an overhead transport device 10 to temporarily store the articles 3 transported by the overhead transport device 10, it can be adapted not only to the article transport facility having the overhead transport device 10 but to various other types of article transport facilities.

(3) Although the articles 3 are containers for storing semiconductor substrates in the embodiments described above, the articles may be other objects.

The present invention may be advantageously applied to an article storage facility including an article storage rack having a plurality of storage units arranged in a vertical direction and in a lateral direction, and an article transport device which can transport articles to each storage unit in the article storage rack.

The invention claimed is:

1. An article storage facility comprising:
an article storage rack having storage units arranged in a vertical direction and in a lateral direction, and
an article transport device which is capable of transporting articles to each of the storage units in the article storage rack,
wherein the article transport device includes a movable body movable in a rack lateral width direction of the article storage rack, a vertical movement guiding mast movable with respect to the movable body in the rack fore and aft direction of the article storage rack, and an article support which is movable to a projected position for article transfer to and from the storage unit and to a pulled back position away from the storage unit by a movement of the vertical movement guiding mast in the rack fore and aft direction, the article support being guided and supported by the vertical movement guiding mast for vertical movement,
wherein the vertical movement guiding mast is arranged to stand vertically on a pedestal supported to the movable body to be movable in the rack fore and aft direction at an end away from the article storage rack,
the pedestal is movable along a rack fore and aft travel rail provided to the movable body and extending in the rack fore and aft direction,
the rack fore and aft travel rail and the movable body have ends, respectively, adjacent to the article storage rack in the rack fore and aft direction that are arranged in a space under the article storage rack, and
wherein an end of the pedestal closer to the article storage rack in the rack fore and aft direction is configured to enter the space under the article storage rack when the pedestal is moved toward the article storage rack to place the article support to the projected position.

2. The article storage facility as defined in claim 1, wherein the movable body is configured to be movable along a rack lateral width travel rail provided on a floor side and extending along the rack lateral width direction.

3. The article storage facility as defined in claim 2, wherein one or more storage units arranged at the topmost part among the storage units are configured to be one or more storage units for taking articles in and out, to or from which an overhead transport device, which is movable along a travel path located near a ceiling, can transfer articles, and the article transport device is configured to be capable of transporting an article, which has been transferred from the overhead transport device to the storage unit for taking articles in and out, to other storage unit, and to be capable of transporting an article from a storage unit other than the storage unit for taking articles in and out to the storage unit for taking articles in and out.

4. The article storage facility as defined in claim 1, wherein one or more storage units arranged at the topmost part among the storage units are configured to be one or more storage units for taking articles in and out, to or from which an overhead transport device, which is movable along a travel path located near a ceiling, can transfer articles, and the article transport device is configured to be capable of transporting an article, which has been transferred from the overhead transport device to the storage unit for taking articles in and out, to other storage unit, and to be capable of transporting an article from a storage unit other than the storage unit for taking articles in and out to the storage unit for taking articles in and out.

5. The article storage facility as defined in claim 4, wherein the movable body is configured to be movable along a rack lateral width travel rail provided on a floor side and extending along the rack lateral width direction.

6. The article storage facility as defined in claim 1, wherein a movable body actuating device for moving the movable body in the rack lateral width direction is provided in the space under the article storage rack.

7. The article storage facility as defined in claim 1, wherein the article storage rack includes a pair of side frames spaced apart from each other in the rack fore and aft direction, and the space under the article storage rack is defined lower than the lowest storage unit of the article storage rack between the pair of side frames in the rack fore and aft direction.

8. An article storage facility comprising:
an article storage rack having storage units arranged in a vertical direction and in a lateral direction, and
an article transport device which is capable of transporting articles to each of the storage units in the article storage rack,
wherein the article transport device includes a movable body movable in a rack lateral width direction of the article storage rack, a vertical movement guiding mast movable with respect to the movable body in the rack fore and aft direction of the article storage rack, and an article support which is movable to a projected position for article transfer to and from the storage unit and to a pulled back position away from the storage unit by a movement of the vertical movement guiding mast in the rack fore and aft direction, the article support being guided and supported by the vertical movement guiding mast for vertical movement,
wherein the vertical movement guiding mast is arranged to stand vertically on a pedestal supported to the movable body to be movable in the rack fore and aft direction at an end away from the article storage rack,
wherein an end of the pedestal closer to the article storage rack in the rack fore and aft direction is configured to enter a space under the article storage rack when the pedestal is moved toward the article storage rack to place the article support to the projected position, wherein end side storage units which are the storage units that are located at an end in the rack lateral width direction and which are arranged in a vertical column are positioned closer to the vertical movement guiding mast in the rack fore and aft direction than central storage units that are the storage units that are positioned in a central part in the rack lateral width direction and which are arranged in a vertical column, wherein the article transport device is adapted to be capable of moving the article support to the projected position for one of the central storage units and to an end side same position which is a same position as the end side storage units in the rack fore and aft direction by a movement of the vertical movement guiding mast in the rack fore and aft direction with the article support located opposite the one of the central storage units in the rack fore and aft direction and to be capable of moving the article support to the projected position for one of the end side storage units by a movement of the movable body in the rack lateral width direction with the article support located in the end side same position, and a first position is defined as a position of the movable body in the rack lateral width direction when the movable body is located opposite the central storage units, wherein each of the end side storage units has an opening for allowing an article to be moved to within the end side storage unit, the opening being located at a second position spaced apart from the first position in the rack lateral width direction, wherein the movable body is configured to be able to move away from the first position to a position opposite to the first position farther than the second position in the rack lateral width direction, wherein each of the end side storage units is configured to allow at least a part of the article support to be moved to within the end side storage unit when the movable body is moved away from the first position to the position opposite to the first position farther than the second position.

9. The article storage facility as defined in claim 8, wherein the movable body is configured to be movable along a rack lateral width travel rail provided on a floor side and extending along the rack lateral width direction, wherein the rack lateral width travel rail extends at least from the first position to the position opposite to the first position farther than the second position.

\* \* \* \* \*